United States Patent [19]
Laub et al.

[11] Patent Number: 6,127,900
[45] Date of Patent: Oct. 3, 2000

[54] DUAL FREQUENCY SYNTHESIS SYSTEM

[75] Inventors: Dana Vincent Laub; Julian L. Tham; Roy H. Fladager, all of Irvine, Calif.

[73] Assignee: Conexant Systems, Inc., Newport Beach, Calif.

[21] Appl. No.: 09/163,735

[22] Filed: Sep. 30, 1998

[51] Int. Cl.[7] .............................. H03B 5/12; H03L 7/099; H03J 3/20; H03J 5/24

[52] U.S. Cl. ................... 331/179; 331/36 C; 331/177 V; 331/181; 334/56; 334/58

[58] Field of Search .............................. 331/2, 8, 16, 25, 331/34, 36 R, 36 C, 177 V, 179, 181; 327/156–159; 334/56–58

[56] References Cited

U.S. PATENT DOCUMENTS

| | | | |
|---|---|---|---|
| 5,714,915 | 2/1998 | Brilka | 331/117 R |
| 5,745,013 | 4/1998 | Hohmann | 331/179 |
| 5,852,384 | 12/1998 | Sakakura et al. | 331/48 |
| 5,892,410 | 4/1999 | Peckham | 331/117 R |

Primary Examiner—David Mis

Attorney, Agent, or Firm—Price Gess & Ubell

[57] ABSTRACT

The present invention includes a Voltage Controlled Oscillator (VCO) having a resonant circuit capable of being quickly switched between two resonant frequencies in order to generate two different LO frequencies. In a preferred embodiment, the present invention includes a VCO having a dual-frequency resonant circuit attached to the VCO's resonant circuit input leads. The dual-frequency resonant circuit is constructed in a differential architecture in order to create a number "virtual ground" points within the circuit that nearly eliminate any ground currents, and thus minimize the time required to switch the resonant circuit between the two LO frequencies. The switching between two resonant frequencies is achieved by creating a short circuit across certain components within the circuit to eliminate them from the resonant circuit. The combination of the differential architecture dual-frequency resonant circuit with a single VCO provides for the power efficient and space-saving generation of both LO frequencies needed for a wireless transceiver. Moreover, by requiring only one resonant circuit, the area on the circuit board within the wireless transceiver is greatly reduced, resulting in a smaller transceiver circuit.

11 Claims, 2 Drawing Sheets

DUAL FREQUENCY SYNTHESIS SYSTEM

BACKGROUND OF THE INVENTION

1. Field of the Invention

The present invention relates generally to wireless communication systems. More particularly, the present invention relates to a frequency synthesis system having a voltage controlled oscillator and resonant circuit that generates the local oscillator frequencies required by a wireless communication system which must rapidly change between two different frequencies, such as a transmit frequency and a receive frequency.

2. Description of the Related Art

As with most electronics devices, the increasing popularity of wireless communication systems is forcing the developers of these systems to continually innovate in order to compete in the industry. Such areas of innovation include the minimization of the size of the wireless transceivers and the decrease of power consumption of the device in order to provide for extended periods of battery-powered operation.

One method of minimizing the size of the wireless transceiver is to develop multi-purpose semiconductor components that serve more than one function within the transceiver. Despite the development of these multi-purpose semiconductors, the frequency synthesis devices currently available on the market typically require two different resonant circuits in order to generate different local oscillator (LO) frequencies, such as the receive LO frequency and the transmit LO frequency. This redundancy may include having two (2) separate voltage controlled oscillators (VCO) each having its own resonant circuit for generating the two LO required to operate the transceiver. Unfortunately, the redundant VCO and resonant circuit requires a great deal of power, even if each VCO is only powered during its respective transmit or receive period.

One method of overcoming the redundancy of a two VCO frequency synthesis system is the development of a VCO having two different resonant circuits. In this solution, each resonant circuit is tuned to generate its particular LO frequency, and the VCO is switched between the two resonant circuits in order to generate the two LO frequencies. Although this solution eliminates one VCO from the transceiver, the time period required for the switching between resonant circuits and the necessary settling time for that circuit, prohibits the rapid switching between the two LO. Moreover, the incorporation of two resonant circuits, and the isolation needed due to their susceptibility to electromagnetic interference (EMI), results in a VCO circuit of considerable size.

The inability of the frequency synthesis system to rapidly switch from one frequency to another is further apparent when attempting to change from a LO frequency of 600 MHZ to 900 MHZ, for example. Such a frequency change is required for many wireless transceiver applications because the transmit frequency band is often separated from the receive frequency band by a large isolation band of several hundred megahertz. While this frequency difference provides for a full duplex wireless communication system having lower channel interference, the number of components of various sizes needed to create such a wide band resonant circuit is high.

In light of the above, it would be advantageous to provide a frequency synthesis system which minimizes both the size of the required circuitry, the number of active and discrete components, and the power required to operate the system.

Further, it would be advantageous to provide a frequency synthesis system having a VCO circuit that would incorporate only a single resonant circuit that may be quickly modified to facilitate the generation of two LO frequencies using a single VCO.

SUMMARY OF THE INVENTION

Broadly, the present invention provides for a frequency synthesis system including a Voltage Controlled Oscillator (VCO) having a resonant circuit capable of being quickly switched between two resonant frequencies. In a preferred embodiment, the present invention includes a VCO having a dual-frequency resonant circuit. The dual-frequency resonant circuit is constructed in a differential architecture in order to create a number "virtual ground" points within the circuit that minimize the time required to switch the resonant circuit between two frequencies. The switching between two resonant frequencies is achieved by creating a short circuit across a pair of inductors within the circuit that switches the resonant frequency to a higher frequency.

Although certain components within the resonant circuit may be switched in and out of the circuit, the differential architecture of the circuit minimizes the stabilization time for the resonant circuit. Consequently, the LO frequency generated by the VCO may be nearly instantaneously switched from one LO frequency to a second LO frequency, simply by electrically shorting a pair of inductors in the resonant circuit. The differential architecture results in a number of virtual ground points that serve to minimize any ground-loop currents, in turn minimizing harmonic frequency generation.

The combination of the differential architecture dual-frequency resonant circuit with a single VCO provides for the power efficient and space-saving way of generating two widely spaced LO frequencies typically needed for a wireless transceiver. Moreover, by requiring only one resonant circuit, the area on the circuit board within the wireless transceiver is greatly reduced, resulting in a smaller transceiver circuit.

BRIEF DESCRIPTION OF THE DRAWINGS

The nature, objects, and advantages of the invention will become more apparent to those skilled in the art after considering the following detailed description in connection with the accompanying drawing, in which like reference numerals designate like parts throughout, and wherein.

GLOSSARY OF SCHEMATIC REFERENCE NUMBERS

TABLE 1

Typical Component Values

Figure 1:
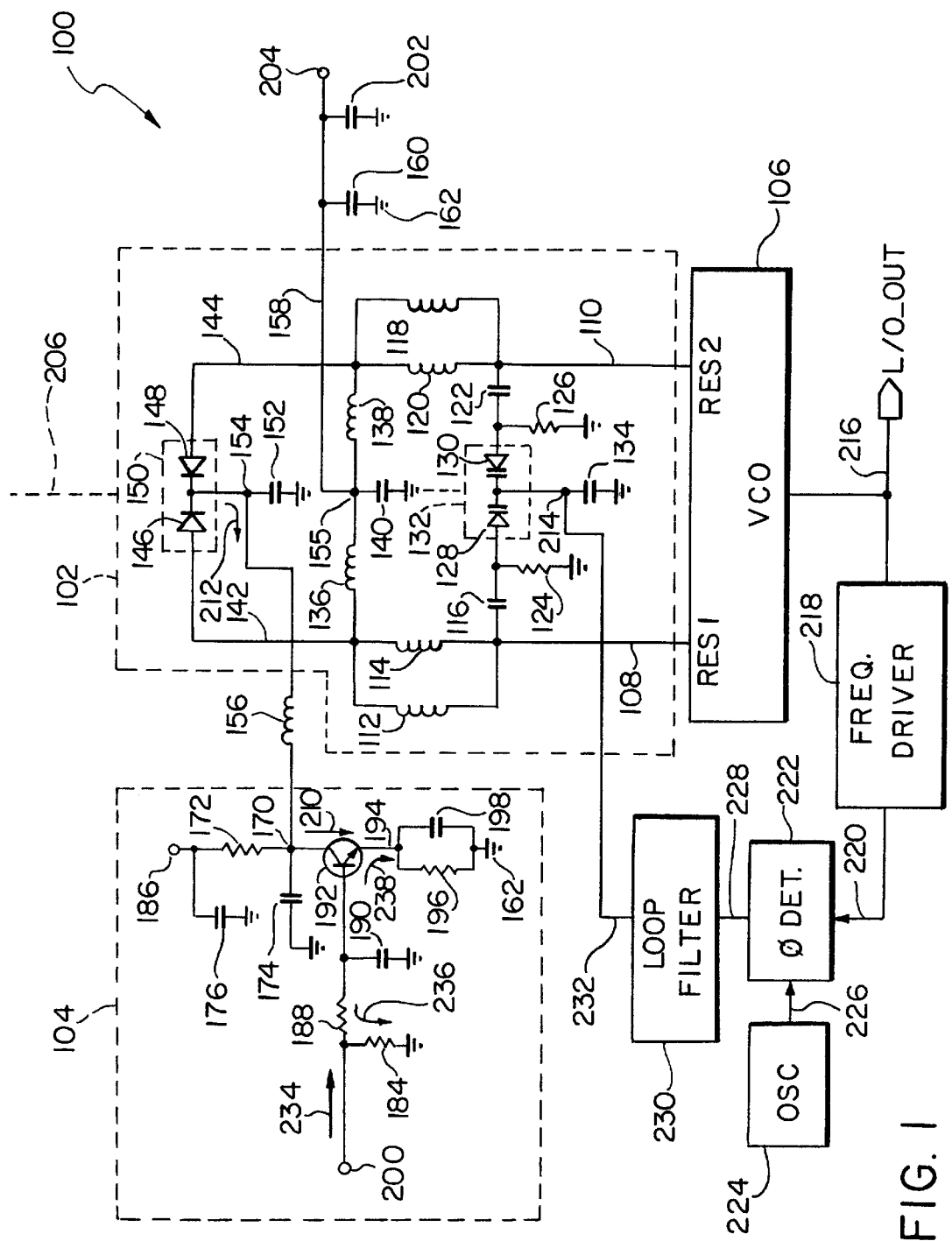
FIG. 1 is a schematic diagram of a frequency synthesis system which incorporates the dual-frequency differential VCO of the present invention, showing the dual-frequency resonant circuit, a control circuit for switching between two resonant frequencies, a frequency divider circuit, a phase detector circuit, an oscillator circuit and a loop filter circuit.

| Reference # | Schem. ID | Comp. Type | Description |
| --- | --- | --- | --- |
| 100 | | Schematic Diagram | Frequency Synthesis System |
| 102 | | VCO subcircuit | Dual-Frequency Resonator Circuit |
| 104 | | VCO subcircuit | Switching Control Subcircuit |
| 106 | | VCO | Voltage Controlled Oscillator |
| 108 | RES1 | Resonator input 1 | Input to VCO |
| 110 | RES2 | Resonator input 2 | Input to VCO |
| 112 | L7 | Inductor | 6.8 nH |
| 114 | L4 | Inductor | 6.8 nH |
| 116 | C12 | Capacitor | 8.2 pF |
| 118 | L8 | Inductor | 6.8 nH |
| 120 | L5 | Inductor | 6.8 nH |
| 122 | C13 | Capacitor | 8.2 pF |
| 124 | R5 | Resistor | 3 K |
| 126 | R6 | Resistor | 3 K |
| 128 | D1 | Diode* | (part of varactor) |
| 130 | D2 | Diode* | (part of varactor) |
| 132 | D3 | Varactor | SMV1204-133 |
| 134 | C11 | Capacitor | 33 pF |
| 136 | L2 | Inductor | 6.8 nH |
| 138 | L3 | Inductor | 6.8 nH |
| 140 | C7 | Capacitor | 33 pF |
| 142 | | Node | |
| 144 | | Node | |
| 146 | D4 | Diode | (Part of varactor) |
| 148 | D5 | Diode | (Part of varactor) |
| 150 | D6 | Diode Network | HSMP-3824 |
| 152 | C6 | Capacitor | 33 pF |
| 154 | | Node | |
| 155 | | Node | Virtual Ground Node |
| 156 | L1 | Inductor | 68 nH |
| 158 | | Node | Output Node |
| 160 | C8 | Capacitor | 100 pF |
| 162 | | Ground | Signal Ground |
| 170 | | Node | Control Signal Node |
| 172 | R4 | Resistor | 4.7 K |
| 174 | C5 | Capacitor | 1000 pF |
| 176 | C35 | Capacitor | 100 pF |
| 184 | R1 | Resistor | 4.7 K |
| 188 | R2 | Resistor | 4.7 K |
| 190 | C3 | Capacitor | 1000 pF |
| 192 | Q1 | NPN Transistor | MMBT2222L |
| 194 | | Node | Emitter lead of Q1 |
| 196 | R3 | Resistor | 1 K |
| 198 | C4 | Capacitor | 1000 pF |
| 200 | | Input Lead | Input Control Lead |
| 202 | C9 | Capacitor | 1000 pF |
| 204 | | Output Lead | Output Sense Lead |
| 206 | | Symmetry Line | Symmetry Of Differential Circuit |
| 210 | | Current Flow | Current Flow Through Q1 |
| 212 | | Current Flow | Current Flow Q1 in "ON" State |
| 214 | | Node | Virtual Ground Node |
| 216 | | Frequency Output | VCO LO Frequency Output |
| 218 | | Frequency Divider | Divide by "N" Frequency Divider |
| 220 | | Signal Input | Input from Frequency Divider Circuit |
| 222 | | Phase Detector | Phase Detector |
| 224 | | Oscillator | Frequency Oscillator/Generator |
| 226 | | Signal Output | Frequency Oscillator Output |
| 228 | | Signal Output | Phase Detector Output |
| 230 | | Loop Filter | Loop Filter |
| 232 | | Signal Output | Loop Filter DC Output |
| 234 | | Current Flow | Current Flow - Control Signal "High" |
| 236 | | Current Flow | Current Flow - Control Signal "Low" |
| 238 | | Current Flow | Current Flow Through Base of Q1 |

DETAILED DESCRIPTIONS

In order to facilitate the detailed understanding of the frequency synthesis system of the present invention, shown in FIG. 1 and generally designated 100, a Prior Art frequency synthesis system is shown and will be discussed in conjunction with FIG. 2.

Prior Art Frequency Synthesis System Architecture

Figure 2:
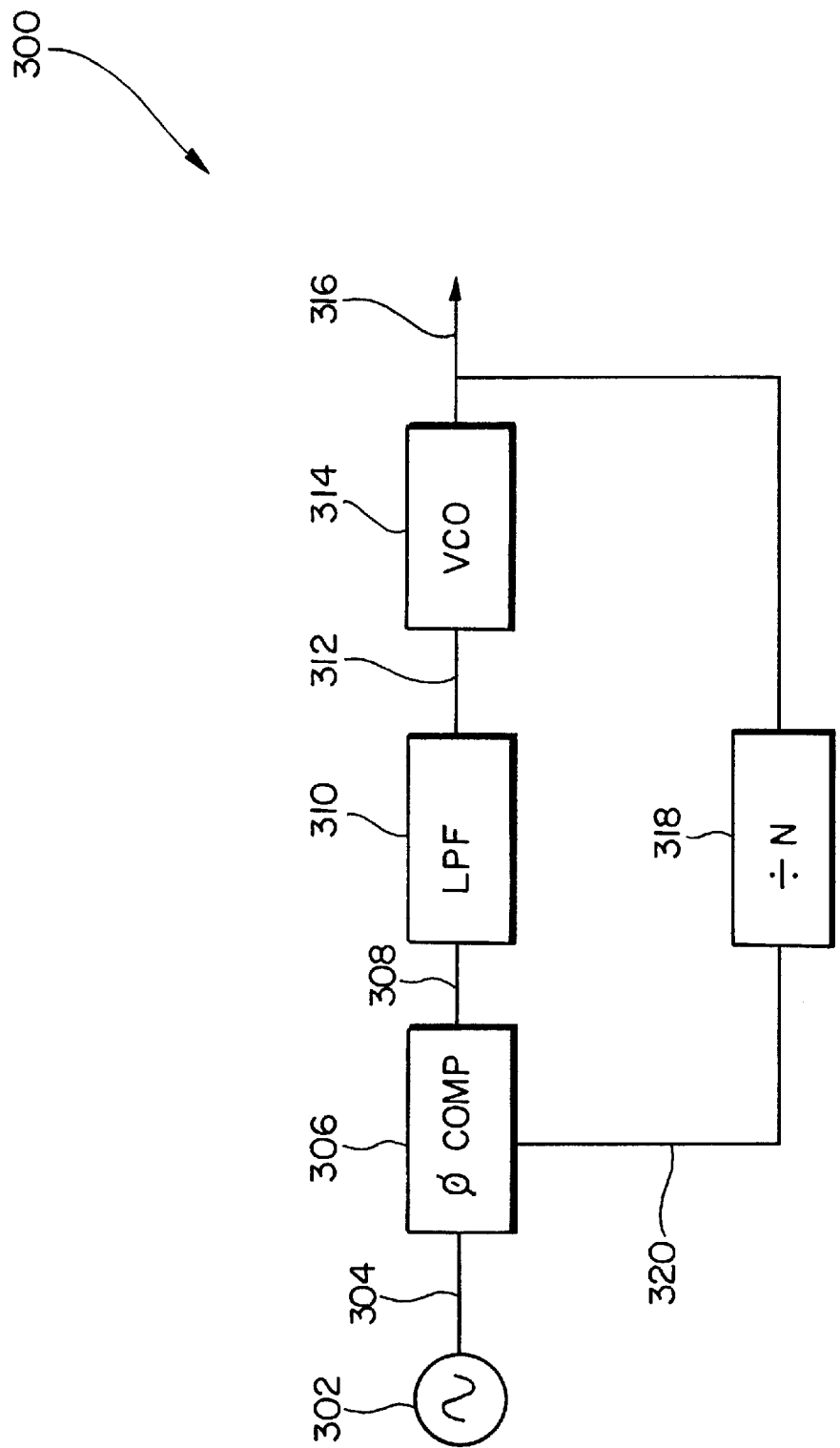
FIG. 2 is a block diagram of a frequency synthesis system showing the reference signal generator, phase comparator, low pass filter, voltage controlled oscillator (VCO), and divider network used to generate a frequency that is a multiple of frequency of the reference signal.

A typical Prior Art frequency synthesis system is shown in FIG. 2, is generally designated 300, and will be discussed to more thoroughly point out the novelty of the present invention. System 300 includes a base frequency generator 302, such as a crystal oscillator, that provides a fixedfrequency signal output 304 that is fed into a phase comparator 306. As will be more fully discussed below, phase comparator 306 generates an output signal that is proportional to the difference between the phases of its two input signals 304 and 320. Output 308 of phase comparator 306 is a complex signal containing sum and difference frequencies. The sum component is removed by the low pass filter 310, also called a "loop filter," to leave the difference frequency—a slowly varying DC level on output 312 representing the error between the two inputs 304 and 320.

The DC error signal on 312 is then fed into VCO 314 as a control voltage to correct the output frequency of the VCO on line 316. In this manner, when the frequency synthesis system is locked, the error signal on line 312 is zero. In order to zero the error signal, the VCO output 316 is fed back into a divider 318 that divides the VCO output frequency by a set scalar value. This is considered a "divide-by-"N" frequency divider", and results in output 320 being 1/N the output frequency.

As is known in the art, VCO 314 is a sinusoidal oscillator whose frequency is controlled by a voltage level at the device input. More specifically, VCO 314 is an oscillator whose output frequency is a function of its input voltage over some range of input and output. A positive input voltage will cause the VCO output frequency to be greater than its uncontrolled value, while a negative voltage will cause it to be less. In system 300, if the frequency on line 320 is not equal to the reference frequency on line 304, the error signal on line 308 will vary from its "no-error", or typical DC value. In such circumstances, VCO 314 will slew its frequency either higher or lower in order to force the error voltage on line 312 back to its typical DC value. When the error voltage is its typical DC value, the frequency synthesizer system is considered "locked", and the frequency of VCO output 316 will be exactly "N" times the reference frequency on reference frequency input 304.

Not shown in FIG. 2 is the circuitry required by VCO 314 that determines the uncontrolled frequency of the VCO. This uncontrolled frequency is also called the "free-running" frequency of the VCO. This circuitry typically includes a number of passive components, including inductors, capacitors and resistors, that set the uncontrolled oscillation frequency of the VCO. Thus, it is to be understood that the free-running frequency of a VCO is determined by the selection of its passive components. This is considered the "coarse" frequency selection of the VCO.

Once the coarse frequency has been determined by the selection of the passive components, the output frequency of the VCO may be slightly increased or decreased in response to a phase error signal. This frequency change in response to the phase error signal is considered the "fine" frequency selection.

Because the fine frequency selection of a VCO may only provide a small frequency adjustment, such as a three percent (3%), or 27 MHZ, frequency variation, it is necessary to properly and carefully select the VCO passive components. This is particularly so in a wireless communication system wherein the transmit frequency band is 900 MHZ, with a 40 MHZ bandwidth. In such an instance, the coarse frequency of the VCO is set to the radio frequency (RF) +/− the intermediate frequency (IF), and the fine frequency adjustments will provide for the required fine tuning.

The ability to increase or decrease the output frequency of the VCO is limited by the passive components discussed above. More specifically, as with any resonant circuit, the combination and value of resistors, capacitors and inductors will determine the resonant frequency for the circuit. Consequently, in wireless communication systems requiring both a transmit and a receive LO frequency separated by an isolation band, such as most modern duplex communications devices, it is necessary to incorporate two (2) frequency synthesis systems 300—one system to generate the transmit LO frequency, and the second to generate the receive LO frequency. As can be appreciated, such redundancy wastes a great deal of valuable circuit board area, as well as doubles the power required for LO frequency generation.

Dual Frequency Synthesis System

Referring again to FIG. 1, the Dual Frequency Synthesis System of the present invention is shown and generally designated 100. System 100 is capable of generating one of two LO frequencies in two very different frequency bands, such that a single frequency synthesis system 100 may generate both the transmit LO frequency and the receive LO frequency, even if such frequencies are quite different. System 100 includes a voltage controlled oscillator 106 equipped with a dual-frequency resonant circuit 102 and control circuit 104 for switching circuit 102 between the two resonant frequencies, a frequency divider circuit 218, a phase detector circuit 222 receiving a reference frequency signal from oscillator 224, and a loop filter 230.

Like System 300, the frequency generation of system 100 of the present invention is accomplished by feeding back a portion of the VCO output through a scalar divider 218, to a phase detector 222 which compares the phase between the divided feedback signal and the reference frequency from the reference oscillator 224. A phase error signal based on the phase comparison generated on output 228 and is passed through the loop filter 230 and fed via output 232 into the dual-frequency resonant circuit to generate an output LO frequency that is locked with the reference oscillator frequency.

Control Circuit Description

Control of the dual-frequency resonant circuit 102 is accomplished by control circuit 104, and includes a switching mechanism for effectively shorting a pair of the passive components from the dual-frequency resonant circuit 102. Signal input 200 is provided by digital control logic (not shown) and corresponds to the particular LO being generated. For example, for a lower LO, the signal input 200 may be a logic "0", and for a higher LO, the signal input 200 may be a logic "1".

As shown in FIG. 1, signal input 200 is fed into the base of transistor 192 through resistor 188. When signal input 200 is in the logic "1" state, current flows in direction 234, through resistor 188 thereby charging capacitor 190 and providing a base current 238 through transistor 192. In this manner, transistor 192 is placed in an "ON" state, and current flows from node 170 in direction 210 through the collector of transistor 192 and out emitter 194, through resistor 196 to ground 162.

A DC voltage is provided to point 186 and decoupling capacitor 176 to provide a stable voltage across resistor 172 and node 170. Capacitor 174 provides AC filtering such that node 170 only experienced a low frequency, or DC, voltage. Thus, once transistor 192 is turned "ON" a DC current flows from node 170 in direction 210 through transistor 192 and resistor 196 to ground, effectively shorting node 170 to ground.

When signal input 200 is in a logic "0", current flows from capacitor 190 through resistors 188 and 184, in direction 236, to ground 162. Consequently, the voltage at the base of transistor 192 goes to zero, and the transistor is no longer in a conducting state, but rather is in its "OFF" state causing current flowing through the transistor in direction 210 to stop. Once this current flow has stopped, the voltage at node 170 increases to the supply voltage provided at point 186 as capacitor 174 is charged through resistor 172.

When the signal input 200 is in a logic "1" state, transistor 192 is "ON" and inductor 156 is shorted to ground. On the other hand, when the signal input 200 is in a logic "0" state, transistor 192 is "OFF" and inductor 156 is not shorted to ground.

Dual-Frequency Resonant Circuit—Coarse Frequency Adjustment

Dual-frequency resonant circuit 102 includes a differential combination of passive components selected to determine the free-running frequency of the VCO. The coarse frequency adjustment of frequency synthesizer system 100 includes the modification of the resonant circuit 102 by the electrical shorting of certain resonant components. The electrical shorting of various components, as will be discussed in greater detail below, is accomplished by electrically short circuiting these components to signal ground.

Circuit 102 is attached to the RES1 resonant circuit terminal 108 and the RES2 resonant circuit terminal 110 of VCO 106, and provides the resonant circuit to determine the free-running VCO frequency. In circuit 102, inductors 112 and 114 combine with inductor 136 to provide an equivalent inductor between RES1 108 and node 155. Similarly, inductors 118 and 120 combine with inductor 138 to provide an equivalent inductor between RES2 110 and node 155. Because node 155 is biased to a DC voltage by supply voltage input 204 and decoupling capacitors 160 and 202, inductors 136 and 138 connect at capacitor 140, and are held at a DC level, while capacitor 140 bypasses all AC signals to ground. This node 155 is a virtual ground, wherein current flowing through inductor 136 is the same magnitude of current flowing through inductor 138, and thus there is a conservation of current through the network, and none of this current is being returned via a ground connection. Consequently, inductors 136 and 138 are actively in circuit 102, and contribute to the overall resonance of the circuit.

The voltage at node 154 determines the coarse free-running frequency of frequency synthesis system 100. More specifically, if node 154 has a non-zero voltage, such as when signal input 200 is at a logic "0", voltage at node 170 is also non-zero. This results in inductor 156 not conducting, and no current flows in direction 212 from node 154. In this state, node 154 has a DC voltage, and all AC signal components are bypassed to ground through capacitor 152. Since the voltage at node 154 is non-zero, no current flows through diodes 146 and 148, and all inductors 112, 114, 136, 118, 120 and 138 cooperate to determine the resonant frequency of the circuit 102. Inductor 156 serves as an electrical open circuit at the frequency of operation.

On the other hand, when signal input 200 is at a logic "1", voltage at node 170 is approximately zero, or grounded, and thus all voltage at node 154 flows in direction 212, through inductor 156 to node 170, and effectively to ground through transistor 192. When node 154 is at a low voltage, current from nodes 142 and 144 flow through diodes 146 and 148 to ground through inductor 156 and transistor 192 of the control circuit. This current flow through diodes 146 and 148 pull node 142 to ground potential, and thereby effectively remove inductors 136 and 138 from the resonant circuit 102. In this manner, the resonant frequency of circuit 102 is changed as a result of the elimination of inductors 136 and 138 from the inductor networks.

Importantly, circuit 102 is a differential circuit, providing a circuit that operates without generating significant ground loops or current spikes. In fact, because of the symmetrical design of circuit 102, a number of virtual grounds are created that provided for balanced current flow. Dashed line 206 identifies the separation between the two differential branches of circuit 102.

As can be appreciated from FIG. 1, the differential design of circuit 102 provides for an decreased switching time from one resonant frequency to the next resonant frequency. This is so because the existence of the virtual grounds limits any ground-loop currents which need to be switched on and off, but rather, as the resonant components are switched in and out of the circuit, the return currents are balanced at the virtual ground points.

To minimize the imbalance of the differential circuit 102, it is advantageous to accurately select components having similar characteristics. For instance, diode 146 and 148 should be selected to be as close to an identical match as possible to ensure that node 154 is truly a virtual ground point. To facilitate the selection of components having similar characteristics, it is possible to use a varactor 150 that incorporates two matched diodes 146 and 148. Similarly, varactor 132 may be used instead of variable capacitance diodes 128 and 130, further simplifying the component selection process.

Dual-Frequency Resonant Circuit—Fine Frequency Adjustment

Fine frequency adjustment of the frequency synthesizer system 100 is accomplished by providing the dual-frequency resonant circuit 102 with the error voltage via output 232 from loop filter 230. More specifically, the error voltage from output 232 is provided to node 214 of circuit 102. Phase error signals are typically a DC voltage level. Thus, when the error voltage is at its "no-error", or typical value, such as when the phase detector input 220 from the frequency divider 218 is in phase with the oscillator output 226, a certain amount of current passes through high frequency capacitors 116 and 122 in turn passes through variable capacitor diodes 128 and 130, and is passed to ground through line 232. However, once a phase error appears on line 232, the phase error voltage changes from its typical value, and the current from node 214 also changes. For example, if the phase error voltage increases from its typical value, the current flowing through diodes 128 and 130 decreases. This results in a slight modification of the resonant frequency of resonant circuit 102, causing VCO 106 to slew its generated frequency upwards in an attempt to eliminate the phase error increase on line 232. Once the phase error increase is eliminated, the VCO is said to be "locked" and once again the output frequency on line 216 is a "N" multiple of the oscillator 224 frequency.

Conversely, when the phase error voltage decreases from its typical value, the current flowing through diodes 128 and 130 increases, resulting in a slight modification of the resonant frequency downwards in an attempt to eliminate the phase error voltage decrease on line 232. Similarly, once the phase error decrease is eliminated, the VCO will once again be locked to a "N" multiple of the oscillator 224 frequency.

Due to the capacitance and other electrical characteristics of the oscillator within VCO 106, it is not possible to use the feedback control loop as a means to change the coarse frequency value. More specifically, in an application where a first LO frequency is 600 MHZ and the second LO frequency is 900 MHZ, it is difficult for the VCO to change 300 MHZ using the fine adjustment method only. Consequently, the coarse adjustment method is incorporated to make the major frequency change, and the fine adjustment method is used to fine tune the frequency synthesis system 100 to the desired LO frequency.

Operation of a Preferred Embodiment

The operation of the frequency synthesis system 100 of the present invention begins with the selection of the coarse frequency range using control circuit 104. For example, control signal 200 may be initially in a logic "1" state, effectively eliminating inductors 136 and 138 from resonant circuit 102. In a preferred embodiment, using the typical component values above in Table 1, the resonant frequency of circuit 102 without inductors 136 and 138 may be approximately 900 MHZ.

In a wireless communication system embodying the frequency synthesis system of the present invention, this 900 MHZ LO may correspond to the coarse frequency selection for the center frequency of the transmit frequency band. Further, if the frequency of operation is to be 920 MHZ, for example, oscillator 224 may be set to a corresponding frequency, and through the frequency divider 218 and loop error frequency corrections in the fine frequency adjustment, the VCO desired output frequency 216 may be effectively synthesized as discussed above.

In a preferred embodiment, the fine frequency adjustment may compensate for a range of +/−40 MHZ, for example. Thus, the coarse frequency adjustment may set the resonant frequency of circuit 102 to 900 MHZ, and the fine frequency adjustment may vary the resonant frequency of circuit 102 from 860 MHZ to 940 MHZ.

Once the frequency output 216 of the VCO is stable, the wireless communication device may utilize the synthesized LO frequency, such as for the transmission of a signal. However, once the signal has been transmitted, control signal 200 may be set to a logic "0" state, terminating the current flow through transistor 192 and effectively returning inductors 136 and 138 to circuit 102, and thereby coarsely adjusting the resonant frequency to the second LO. The second LO in a preferred embodiment, for example, may be 600 MHZ.

Once the second LO frequency is selected with control signal 200, the particular frequency of operation, such as 580 MHZ, may be set by a corresponding frequency in oscillator 224. Through frequency divider 218 and loop error frequency corrections in the fine frequency adjustment, the VCO desired output frequency 216 may be effectively synthesized at 580 MHZ in the manner discussed above.

The above-described operation of the frequency synthesis system of the present invention provides for the single VCO generation of both LO signals needed for a wireless transceiver. The frequency synthesis system of the present invention eliminates the need for redundant components in the synthesis circuitry, effectively minimizing power consumption and required circuit board space. Further, the present invention, by incorporation of a differential circuit having virtual ground points, also improves the stabilization time following a coarse frequency adjustment.

While the present invention has been discussed at length with respect generation of two LO signals, it should be appreciated that any number of frequencies may be generated using the same technique as described above. Moreover, by incorporation a number of control circuits 104 which in turn electrically remove resonant components, it is possible to electrically select a coarse frequency from a number of frequencies.

Other Embodiments

Throughout this disclosure, the switching of inductive resonant circuits has been discussed in detail. Such discussions, however, shall not be construed as a limitation on the ability to modify a resonant circuit having other components. In fact, the resonant circuit discussed herein is merely one example of a dual frequency synthesizer system of the present invention, and it should be appreciated that virtually any resonant circuit may be incorporated into the present invention without departing from the scope and spirit of the invention.

While there have been shown what are presently considered to be preferred embodiments of the invention, it will be apparent to those skilled in the art that various changes and modifications can be made herein without departing from the scope and spirit of the invention as defined by the appended claims and their equivalents.

What is claimed is:

1. A dual frequency oscillator comprising:
    a dual frequency resonant circuit having a first and second branch;
    each branch including:
        a first inductor connected to a terminal;
        a second inductor connected between the first inductor and the second inductor of the other branch;
        a switching diode having an anode connected between the first and second inductor and a cathode connected to the cathode of the switching diode of the other branch; and
        a control circuit having an output terminal connected to the cathode of the switching diode of the first and second branch for switching the resonant circuit between a first and second frequency, by applying a DC voltage to the output terminal to switch the resonant circuit to the first frequency and grounding the output terminal to switch the resonant circuit to the second frequency.

2. The resonant circuit of claim 1 wherein the magnitude of the current flowing through the second inductor of the first and second branch are the same.

3. The resonant circuit of claim 2 further comprising a first capacitor connected between the second inductor of the first and second branch and ground for bypassing AC signals to ground.

4. The control circuit of claim 1 further comprising:
    a first resistor connected between the output terminal and a DC voltage supply;
    a transistor connected to the output terminal; and
    a second resistor connected between the transistor and ground.

5. The control circuit of claim 4 wherein a control circuit input signal turns off the transistor to switch the resonant circuit to the first frequency and turns on the transistor to switch the resonant circuit to the second frequency.

6. The dual frequency oscillator of claim 4 further comprising a third inductor connected between the output terminal of the control circuit and the resonant circuit.

7. In a symmetrical resonant circuit having two identical branches, each branch having a first and second inductor, a method for switching the resonant circuit between a first and second resonant frequency comprising the step of:
    short circuiting the second inductor of both branches to switch the resonant circuit between the first and second resonant frequency.

8. The method of claim 7 further comprising the step of grounding both nodes of the second inductor of both branches to switch the resonant circuit between the first and second resonant frequency.

9. The method of claim 7 further comprising the steps of:

connecting a switching diode in parallel with the second inductor of both branches;

opening the switching diode of both branches to switch the resonant circuit to the first resonant frequency; and closing the switching diode of both branches to switch the resonant circuit to the second resonant frequency.

10. The method of claim 9 further comprising the steps of:

connecting a transistor between the switching diode of both branches and ground;

turning off the transistor to open the switching diode of both branches; and turning on the transistor to close the switching diode of both branches.

11. The method of claim 9 further comprising the step of balancing the current flowing through both branches of the resonant circuit to have the same magnitude.

* * * * *